United States Patent [19]
Ryou

[11] Patent Number: 5,296,402
[45] Date of Patent: Mar. 22, 1994

[54] METHOD FOR MANUFACTURING A DRAM HAVING A SECOND EFFECTIVE CAPACITOR AREA

[75] Inventor: Eui K. Ryou, Seochoku, Rep. of Korea

[73] Assignee: Hyundai Electronics Industries Co., Ltd., Kyoungkido, Rep. of Korea

[21] Appl. No.: 88,188

[22] Filed: Jul. 6, 1993

[30] Foreign Application Priority Data

Jul. 7, 1992 [KR] Rep. of Korea ............... 1992-12085

[51] Int. Cl.⁵ .......................................... H01L 21/72
[52] U.S. Cl. ..................................... 437/60; 437/195; 437/915
[58] Field of Search ............. 437/47, 48, 60, 195, 437/915, 919, 978, 979; 148/DIG. 14, DIG. 43

[56] References Cited

U.S. PATENT DOCUMENTS

| | | |
|---|---|---|
| 5,006,481 | 4/1991 | Chan et al. ........................ 437/195 |
| 5,073,510 | 12/1991 | Kwon et al. ....................... 437/978 |
| 5,104,822 | 4/1992 | Butler ................................ 437/60 |
| 5,122,476 | 6/1992 | Fazan et al. ...................... 437/915 |
| 5,219,781 | 6/1993 | Yoneda ............................. 437/60 |

Primary Examiner—Brian E. Hearn
Assistant Examiner—Chandra Chaudhari
Attorney, Agent, or Firm—Darby & Darby

[57] ABSTRACT

A semiconductor memory device and a method for manufacturing the same, capable of increasing the effective cell capacitor area by virtue of steps each defined between a semiconductor substrate surface and each field oxide film formed over the semiconductor substrate. Over the semiconductor substrate, a thin film MOSFET is formed, which includes a charge storage electrode and an active region both connected with a charge storage electrode of each memory cell through a charge storage contact hole. With this structure, a second effective capacitor area is obtained, thereby enabling the capacitance to increase. Also, the semiconductor substrate is connected with a substrate of the thin film MOSFET by a substrate contact hole. Accordingly, it is possible to control the electrical characteristic of the thin film MOSFET. In spite of a decrease in cell area, a higher charge storage capacity can be also obtained.

6 Claims, 5 Drawing Sheets

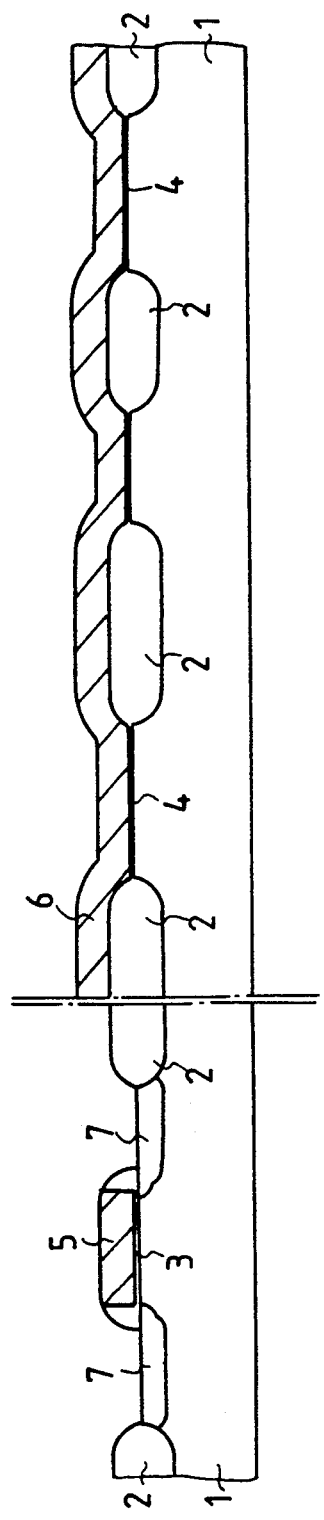
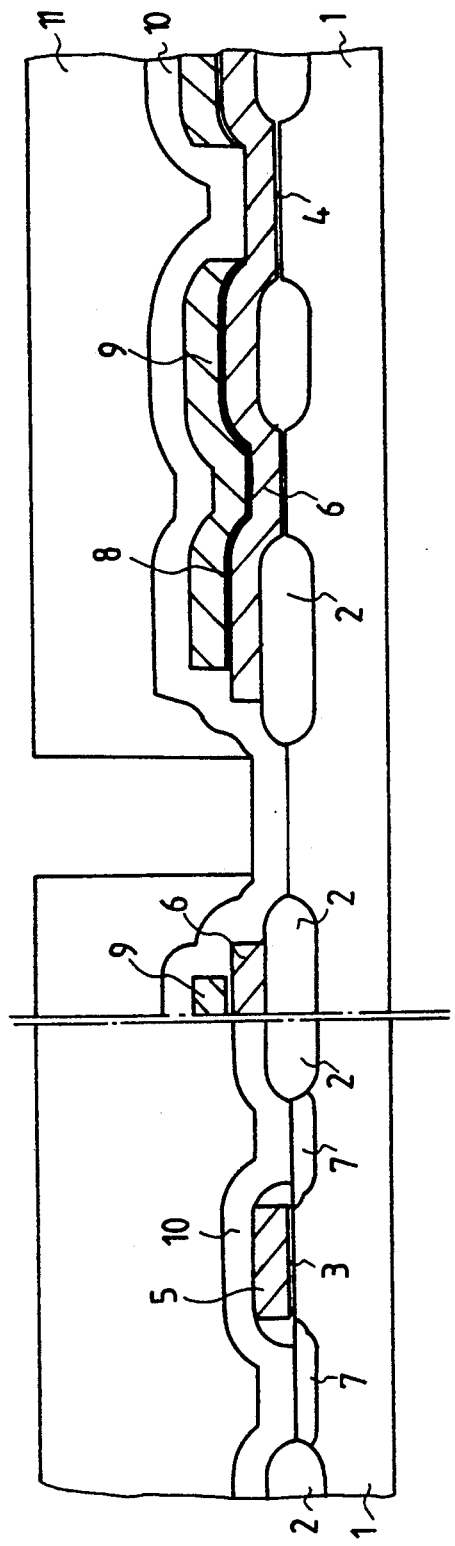

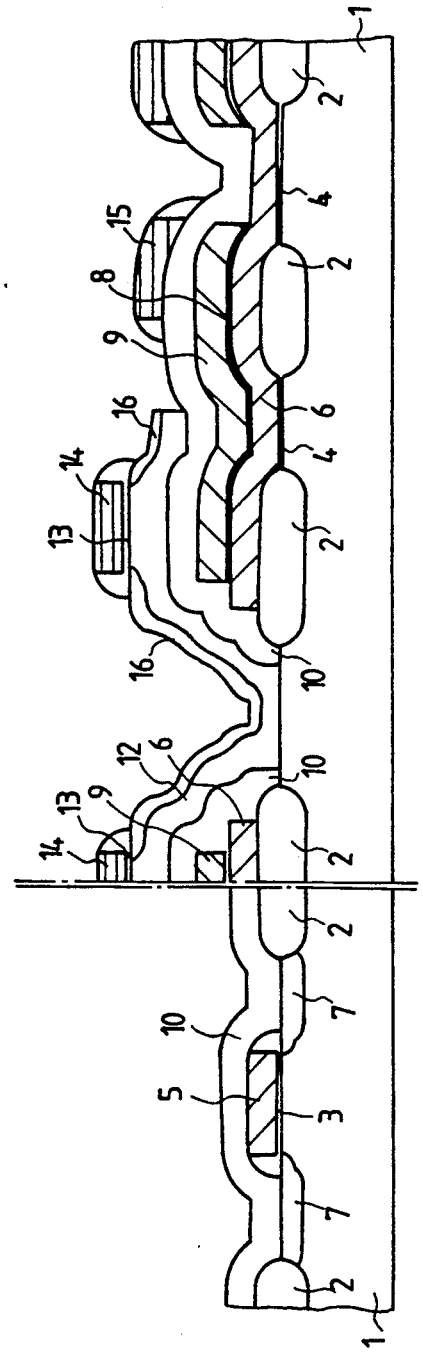
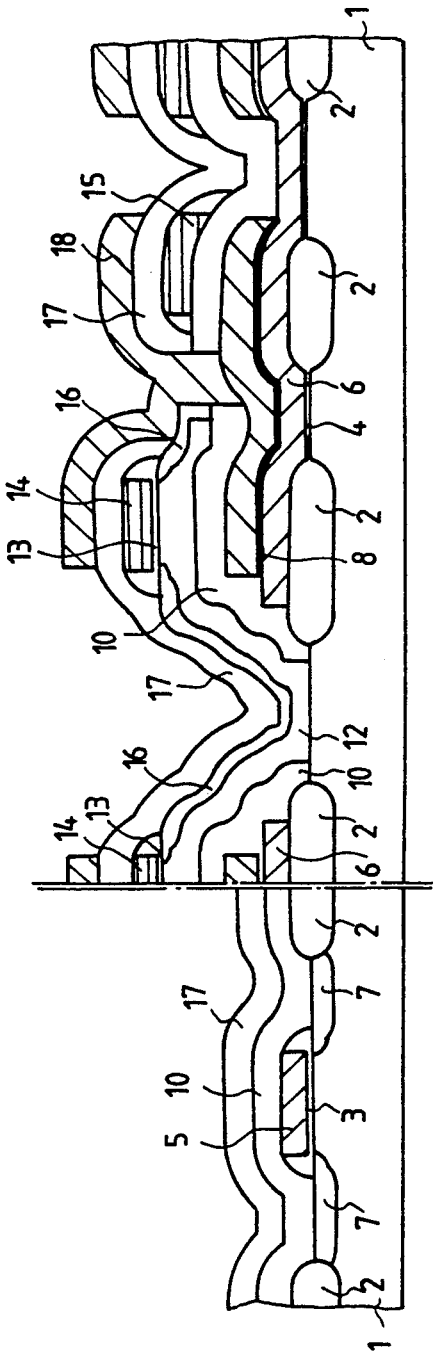

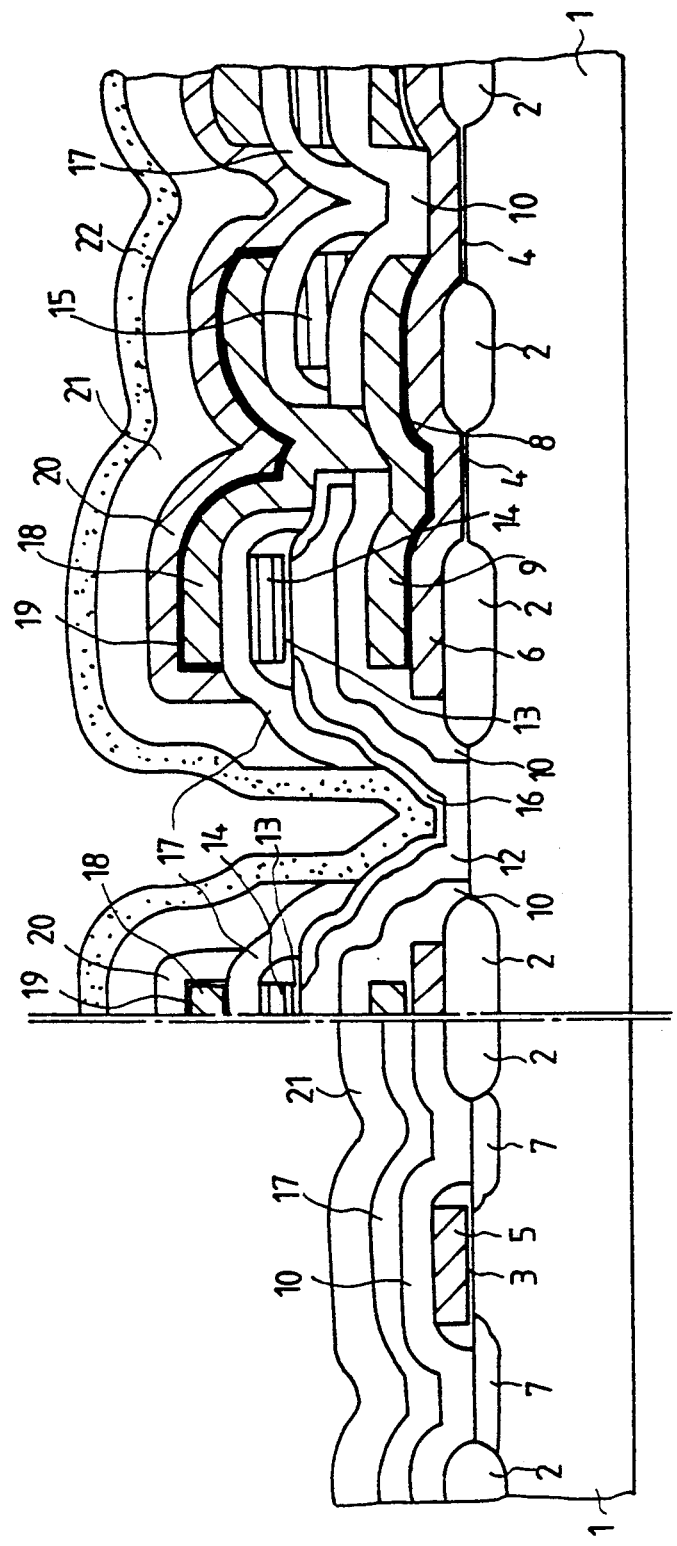

METHOD FOR MANUFACTURING A DRAM HAVING A SECOND EFFECTIVE CAPACITOR AREA

BACKGROUND OF THE INVENTION

1. Field of the Invention

The present invention relates to a semiconductor memory device and a method for manufacturing the same.

2. Description of the Prior Art

Generally, the most important factor for an integration of dynamic random access memories (DRAMs) which are the memory devices having the most wide applications is to provide the charge storage capacities of memory cells.

The most important parameters for the charge storage capacities of DRAM's memory cells include surface areas of charge storage electrodes and thicknesses of dielectric films.

Conventional DRAMs comprise a memory cell circuit and a peripheral circuit with a metal oxide silicon field effect transistor (MOSFET) both formed over a semiconductor substrate. For increasing effective areas of cell capacitors, the trenched structure or the stacked structure is employed.

However, such conventional DRAMs encounter a problem of a complexity of processes due to an increase in topology and thereby a limitation on increase in topology.

SUMMARY OF THE INVENTION

Therefore, an object of the invention is to solve the above-mentioned problems encountered in the prior art and thus to provide a semiconductor memory device and a method for manufacturing the same, capable of increasing the effective cell capacitor area by virtue of steps formed at a field oxide film and providing a sufficient capacity of a charge storage electrode by virtue of a capacitor with a parallel structure.

In accordance with one aspect, the present invention provides a semiconductor device having a plurality of memory cells each provided with a capacitor, each of said memory cell comprising: a semiconductor substrate; a plurality of uniformly spaced field oxide films formed on said semiconductor substrate and a first insulating film formed over a portion of the semiconductor substrate above which said capacitor is to be formed; a first plate electrode formed on said first insulating film, said first plate electrode at least partially covering said field oxide films; a first dielectric film formed over the first plate electrode; a first charge storage electrode formed on said first dielectric film, said first charge storage electrode partially covering two adjacent ones of said field oxide films disposed beneath the first dielectric film; a second insulating film covering both the first charge storage electrode and the first plate electrode; a polysilicon substrate formed over a portion of said second insulating film such that it is in contact with a portion of the semiconductor substrate, which portion is not formed with the field oxide films and the plate electrode; a gate insulating film, a gate electrode and an active region all formed on said polysilicon substrate; a third insulating film covering said gate insulating film, said gate electrode and said active regionl a second charge storage electrode covering said third insulating film and connected with both the first charge storage electrode and the active region; a second dielectric film deposited over said second charge storage electrode; a second plate electrode formed over said second dielectric film, said second plate electrode extending to a region at which a word line is formed; a fourth insulating film covering the second plate electrode; and a bit line formed over said fourth insulating film such that it is in contact with the active region.

In accordance with another aspect, the present invention provides a method of manufacturing a semiconductor memory device having a plurality of memory cells each provided with a capacitor, comprising the steps of: forming a plurality of spaced field oxide films over a semiconductor substrate for each memory cell, depositing a first insulating film over a portion of said semiconductor substrate above which said capacitor is to be formed, forming a first plate electrode over said first insulating film, and a first dielectric film over said first plate electrode; depositing a first charge storage electrode over said first dielectric film and depositing a second insulating film over the entire exposed upper surface of the resultant structure after said step of depositing said first charge storage electrode; exposing a portion of said semiconductor substrate over which said field oxide films are not formed, and depositing a polysilicon film over both said exposed semiconductor substrate portion and a portion of the second insulating film which is disposed over first charge storage electrode, to form a polysilicon substrate; forming, on said polysilicon substrate, a field effect transistor including an active region, a gate insulating film and a gate electrode, and forming a word line on the second insulating film simultaneously with the formation of said gate electrode; depositing a third insulating film over the entire exposed upper surface of the resultant structure after the formation of said field effect transistor, partially exposing both said active region and said first charge storage electrode and forming a second charge storage electrode on a portion of said third insulating film such that it is connected with said exposed portions of the active region and first charge storage electrode; depositing a second dielectric film over said second charge storage electrode and depositing a plate electrode over said second dielectric film; and depositing a fourth insulating film over the entire exposed surface of the resultant structure after the deposition of said plate electrode and forming a bit line in contact with the active region.

BRIEF DESCRIPTION OF THE DRAWINGS

Other objects and aspects of the invention will become apparent from the following description of embodiments with reference to the accompanying drawings in which:

FIGS. 2a to 2e are schematic sectional views illustrating a method for manufacturing the DRAM structure shown in FIG. 1, in accordance with the embodiment of the present invention.

DETAILED DESCRIPTION OF THE PREFERRED EMBODIMENTS

Figure 1:
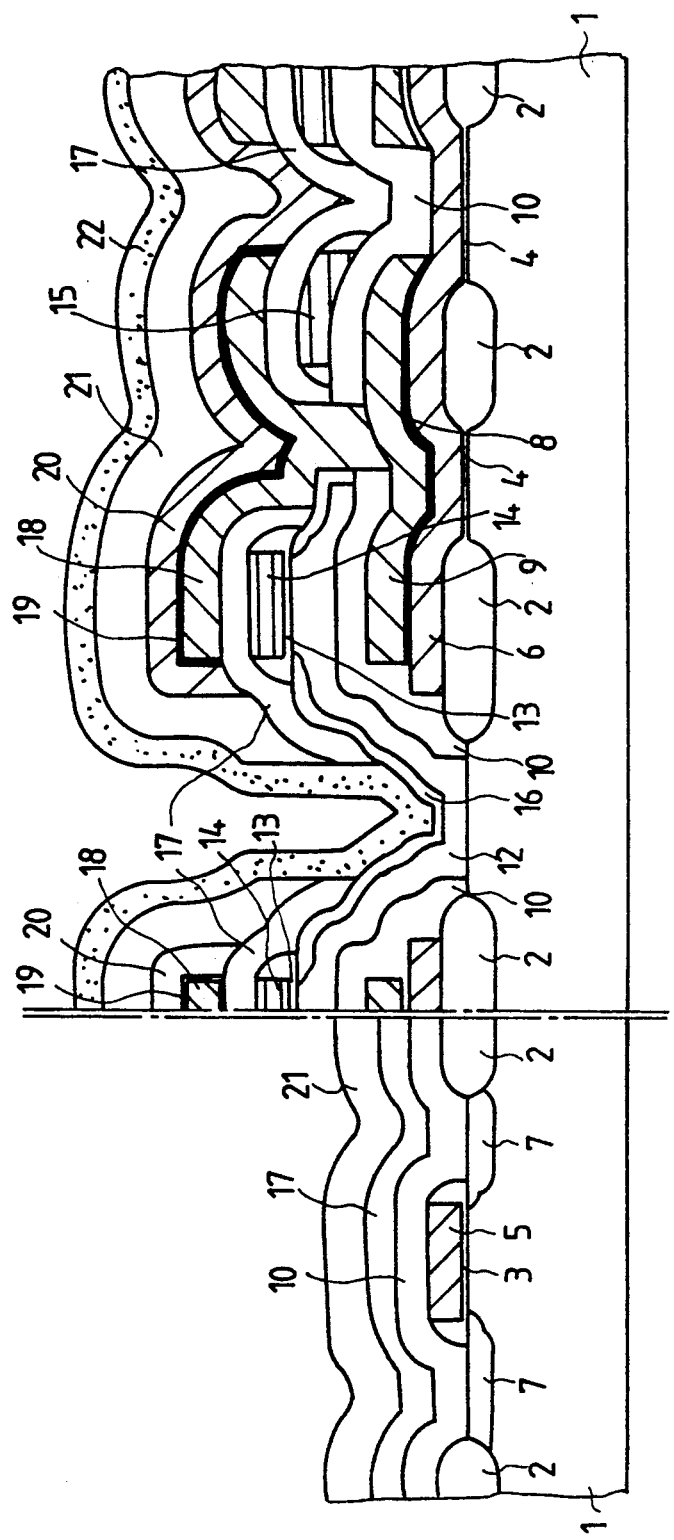
FIG. 1 is a schematic sectional view illustrating a DRAM structure according to an embodiment of the present invention.

Referring to FIG. 1, there is illustrated a DRAM structure according to an embodiment of the present invention. FIGS. 2a to 2e illustrates a method for manufacturing the DRAM structure shown in FIG. 1, in accordance with the present invention.

For a simplicity of the illustration, the left part of each drawing illustrates a cross section of a MOSFET formed over a substrate, constituting the peripheral circuit of DRAM, whereas the right part illustrates a cross section of a unit memory cell of DRAM just after a bit line forming process, taken in a direction parallel to a bit line of the memory cell.

First, the DRAM structure according to the embodiment of the present invention will be described, in conjunction with FIG. 1.

As shown in FIG. 1, the peripheral circuit of DRAM comprises a MOSFET which is a kind of general transistors and comprised of active regions 7, a gate oxide film 3 and a gate electrode 5 disposed on a semiconductor substrate 1.

The memory cell has a parallel capacitor structure.

The field oxide films 2 are disposed on the semiconductor substrate 1 such that adjacent ones are uniformly spaced from each other. Disposed over the field oxide films 2 for the memory cell is an oxide film 4.

Over the oxide film 4, a plate electrode 6 is disposed, which forms a capacitor. A dielectric film 8 is disposed over the plate electrode 6.

Between adjacent field oxide films 2, a charge storage electrode 9 is disposed over the dielectric film 8.

An oxide film 10 is also provided for covering the charge storage electrode 9 and portions of the dielectric film 8 not covered by the charge storage electrode 9.

A polysilicon substrate 12 is disposed on the surface portion of the semiconductor substrate 1, which portion is not formed with the field oxide films 2 and the plate electrode 6. The polysilicon substrate 12 provides a contact.

Formed at the polysilicon substrate 12 is gate oxide films 13, gate electrodes 14 and an active region 16. Oxide films 17 are also provided, which cover gate electrodes 14 and the active region 16. Disposed over each oxide film 17 is a charge storage electrode 18 which is connected with the charge storage electrode 9 and the active region 16.

For parallel capacitors, dielectric films 19 are deposited over the charge storage electrodes 18, respectively. Formed over each dielectric film 19 is a plate electrode 20 which extends to a region disposed over the region at which a word line 15 is formed. For insulating each plate electrode 20, an oxide film 21 is disposed between each plate electrode 20 and each oxide film 17. Disposed over each oxide film 21 is a bit line 22 which is in contact with the active region 16.

The method of manufacturing the above DRAM structure according to the present invention will now be described, in conjunction with FIGS. 2a to 2e.

In accordance with the method, first, on the semiconductor substrate 1, a plurality of spaced field oxide films 2 are formed, which serve to achieve insulations among elements of the peripheral circuit and increase the effective areas of cell capacitors, as shown in FIG. 2a. Thereafter, the gate oxide film 3 and the oxide film 4 are grown on the semiconductor substrate 1. The gate oxide film 3 constitutes a part of the MOSFET to be formed over the portion of semiconductor substrate 1 constituting the peripheral circuit. On the other hand, the oxide film 4 serves to provide an insulation for the portion of semiconductor substrate 1 constituting the memory cell. A polysilicon layer is then deposited over both the gate oxide film 3 and the oxide film 4. The polysilicon layer is subjected to an impurity implantation process and an etching process, so as to form a gate electrode 5 for MOSFET with a predetermined size and a plate electrode 6 with a predetermined size. At this time, the MOSFET of the peripheral circuit is structured to have a lightly doped drain (LDD) structure with spacer oxide films and active regions 7, so as to improve its electrical characteristic.

Over the plate electrode 6, the capacitor dielectric film 8 is grown, as shown in FIG. 2b, which film has a composite structure of oxide-nitride-oxide (ONO) or a composite structure of nitride-oxide (NO). A polysilicon film is then formed over the capacitor dielectric film 8, so as to provide a charge storage electrode 9 over the dielectric film 8. Over the entire exposed upper surface of the resultant structure, the oxide film 10 is deposited for insulations among adjacent layers. Thereafter, a photoresist film 11 is deposited over the oxide film 10 and then patterned to form a photoresist pattern for opening portions of semiconductor substrate 1, which portions are not covered with the plate electrode 6.

Using the photoresist pattern as a mask, the oxide film 10 is selectively etched, as shown in FIG. 2c. Following a removal of the photoresist pattern, a polysilicon film with a predetermined size is deposited over the exposed upper surface of the resultant structure for the memory cell. The polysilicon film is then subjected to a recrystallization process or a heat treatment process, so as to utilize it as the crystallized polysilicon substrate 12 for a thin film MOSFET. The polysilicon substrate 12 is then subjected to an impurity implantation process. Thereafter, gate oxide films 13 for the thin film MOSFET are grown over selected portions of the polysilicon substrate 12. A deposition of polysilicon is then carried out, for forming the gate electrodes 14 with a predetermined size and the word line 15. The polysilicon layer is subjected to an impurity implantation process and then to a patterning for forming a pattern with a predetermined size. Thereafter, the active region 16 for the thin film MOSFET is formed by using the pattern and implementing a high concentration ion implantation process and a thermal process. In this case, the formation of FET is achieved by using the LDD process.

Over the exposed upper surface of the resultant entire structure, another oxide film with a predetermined thickness is deposited, which is then selectively etched, for providing oxide films 17 for insulations among elements, as shown in FIG. 2d. Thereafter, a polysilicon film doped with impurity ions is deposited such that it comes into contact with the charge storage electrode 9 and the active region 16 of the thin film MOSFET, so as to form the charge storage electrodes 18. The etching for forming the charge storage electrodes 18 is carried out, using the same mask as that for the charge storage electrode 9.

After the formation of charge storage electrodes 18, the dielectric film 19 made of ONO or NO is deposited over each charge storage electrode 18, as shown in FIG. 2e. Over each dielectric film 19, the plate electrode 20 is deposited, which is then subjected to an impurity implantation process. For an insulation of the bit line, the film 21 made of boron phosphorous silicate glass (BPSG) is deposited over the exposed upper surface of the resultant entire structure. Thereafter, the BPSG film 21 and the oxide films 17 are orderly etched, so that the bit line comes into contact with the active region 16 for the thin film MOSFET. An impurity-implanted polysilicon film is deposited over the entire exposed upper surface of the resultant structure for the memory cell, so as to form the bit line 22 which is in contact with the active region 16. The bit line 22 may be comprised of a polycide film. In this case, a silicide film is deposited over the polysilicon film, after the impurity implantation.

The DRAM with the above-mentioned structure according to the present invention employs gates for moving MOSFET only in its peripheral circuit and utilizes, as the first effective capacitor areas, the areas obtained by the steps each defined between the semiconductor substrate surface and each field oxide film. Accordingly, it is possible to increase the charge storage capacity per cell. Using the charge storage contact hole, the active region of the thin film MOSFET are connected with the charge storage electrode of the memory cell. With this structure, a second effective capacitor area is obtained, thereby enabling the capacitance to increase. Also, the semiconductor substrate is connected with the substrate of the thin film MOSFET by the substrate contact hole. Accordingly, it is possible to control the electrical characteristic of the thin film MOSFET.

In the DRAM cell according to the above-mentioned embodiment of the present invention, it is possible to obtain the increased effective capacitor area, as compared with the existing cell structures. In spite of a decrease in cell area, a higher charge storage capacity can be also obtained. Moreover, the manufacture is easily achieved, using the existing equipments and techniques. In particular, it is possible to easily carry out photomasking and etching processes which are considered as serious obstacles in manufacturing highly integrated semiconductor devices.

Figure 3:
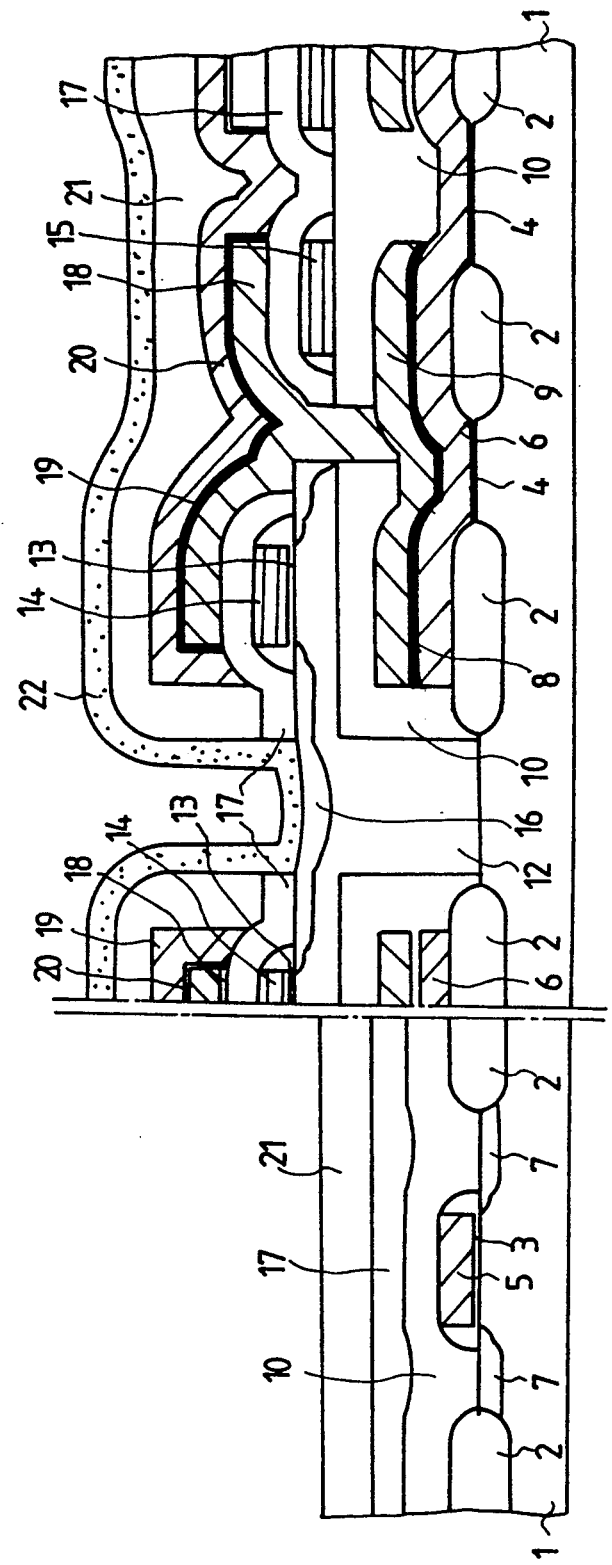
FIG. 3 is a schematic sectional view illustrating a DRAM structure according to another embodiment of the present invention.

Referring to FIG. 3, there is illustrated a method of manufacturing a DRAM in accordance with another embodiment of the present invention. In this case, a smoothing process is carried out by thickening the oxide film 10. Other processes implemented in this case are the same as those of the above-mentioned embodiment illustrated in FIGS. 2a to 2e.

In accordance with the second embodiment, there are effects of obtaining an increased charge storage capacity and minimizing electrical parasitic parameters caused by the curvature of the moving gate active region for thin film MOSFET.

Although the preferred embodiments of the invention have been disclosed for illustrative purpose, those skilled in the art will appreciated that various modifications and additions are possible, without departing from the scope and spirit of the invention as disclosed in the accompanying claims.

What is claimed is:

1. A method of manufacturing a semiconductor memory device having a plurality of memory cells each provided with a capacitor, comprising the steps of:
   forming a plurality of spaced field oxide films over a semiconductor substrate for each memory cell, depositing a first insulating film over a portion of said semiconductor substrate above which said capacitor is to be formed, forming a first plate electrode over said first insulating film, and a first dielectric film over said first plate electrode;
   depositing a first charge storage electrode over said first dielectric film and depositing a second insulating film over the entire exposed upper surface of the resultant structure after said step of depositing said first charge storage electrode;
   exposing a portion of said semiconductor substrate over which said field oxide films are not formed, and depositing a polysilicon film over both said exposed semiconductor substrate portion and a portion of the second insulating film which is disposed over first charge storage electrode, to form a polysilicon substrate;
   forming, on said polysilicon substrate, a field effect transistor including an active region, a gate insulating film and a gate electrode, and forming a word line on the second insulating film simultaneously with the formation of said gate electrode;
   depositing a third insulating film over the entire exposed upper surface of the resultant structure after the formation of said field effect transistor, partially exposing both said active region and said first charge storage electrode and forming a second charge storage electrode on a portion of said third insulating film such that it is connected with said exposed portions of the active region and first charge storage electrode;
   depositing a second dielectric film over said second charge storage electrode and depositing a plate electrode over said second dielectric film; and
   depositing a fourth insulating film over the entire exposed surface of the resultant structure after the deposition of said plate electrode and forming a bit line in contact with the active region.

2. A method in accordance with claim 1, wherein said active region is formed by using a lightly doped drain process.

3. A method in accordance with claim 1, wherein each of said first and second dielectric films is comprised of one of a composite structure of oxide-nitride-oxide and a composite structure of nitride-oxide.

4. A method in accordance with claim 1, further comprising the step of carrying out a smoothing by thickening said second insulating film.

5. A method in accordance with claim 1, wherein said first and second charge storage electrodes are formed by using the same pattern forming mask.

6. A method in accordance with claim 1, wherein said step of forming said bit line comprises the steps of depositing a polysilicon film over the entire exposed upper surface of the resultant structure after the deposition of said fourth insulating film, implanting impurity ions in said polysilicon film and depositing a silicide film over the polysilicon film, to form a polycide film.

* * * * *